United States Patent [19]
Selvidge et al.

[11] Patent Number: 5,850,537
[45] Date of Patent: Dec. 15, 1998

[54] PIPE LINED STATIC ROUTER AND SCHEDULER FOR CONFIGURABLE LOGIC SYSTEM PERFORMING SIMULTANEOUS COMMUNICATIONS AND COMPUTATION

[75] Inventors: Charles W. Selvidge, Charlestown; Anant Agarwal, Framingham, both of Mass.; Johnathan Babb, Ringgold, Ga.; Matthew L. Dahl, Marlboro, Mass.

[73] Assignee: Virtual Machine Works, Inc., Cambridge, Mass.

[21] Appl. No.: 806,542

[22] Filed: Feb. 24, 1997

Related U.S. Application Data

[63] Continuation of Ser. No. 344,723, Nov. 23, 1994, Pat. No. 5,659,716.

[51] Int. Cl.$^6$ .................................................. G06F 9/455
[52] U.S. Cl. ........................ 395/500; 364/488; 364/489
[58] Field of Search ........................... 395/500; 364/578, 364/488, 489, 490, 491; 326/39, 41, 45

[56] References Cited

U.S. PATENT DOCUMENTS

| | | | |
|---|---|---|---|
| 4,495,590 | 1/1985 | Mitchell, Jr. | 364/716 |
| 4,506,341 | 3/1985 | Kalter et al. | 364/786 |
| 4,697,241 | 9/1987 | Lavi | 364/488 |
| 5,109,353 | 4/1992 | Sample et al. | 364/578 |
| 5,260,610 | 11/1993 | Pedersen et al. | 307/465 |
| 5,268,598 | 12/1993 | Pedersen et al. | 307/465 |
| 5,442,306 | 8/1995 | Woo | 326/39 |
| 5,444,394 | 8/1995 | Watson et al. | 326/45 |
| 5,473,266 | 12/1995 | Ahanin et al. | 326/41 |
| 5,483,178 | 1/1996 | Costello et al. | 326/741 |
| 5,485,103 | 1/1996 | Pedersen et al. | 326/41 |
| 5,513,338 | 4/1996 | Alexander et al. | 395/500 |
| 5,572,710 | 11/1996 | Asano et al. | 395/500 |

FOREIGN PATENT DOCUMENTS

| | | | |
|---|---|---|---|
| 0410502A2 | 1/1991 | European Pat. Off. | G06F 15/60 |
| 90/04233 | 4/1990 | WIPO | G06F 15/60 |
| 94/23 389 | 10/1994 | WIPO | G06F 15/60 |

OTHER PUBLICATIONS

Deiss, Connectionism without the Connections, IEEE, pp. 1217–1221, Jun. 27, 1994

Dominques–Castro et al., Architectures and Building Blocks for CMOS VLSI Analog "Neural" Programmable Optimizers, IEEE, pp. 1525–1528, May 1992.

Fornaciari, An Automatic VLSI Implementation of Hopfield ANNs, IEEE, pp. 499–502, Aug. 1994.

Bailey et al., Why VLSI Implementations of Associative VLCNs Require Connection Multiplexing, IEEEpp. 173–180, Jul. 1988.

(List continued on next page.)

*Primary Examiner*—Kevin J. Teska
*Assistant Examiner*—Matthew Loppnow
*Attorney, Agent, or Firm*—Hamilton, Brook, Smith & Reynolds, P.C.

[57] ABSTRACT

A configurable logic system programmed to model a logic design comprises an array of programmable logic modules each configured to perform a partition block of the logic design and a module interconnect providing connections between the modules. The interconnect enables transmission of global links between the partition blocks of the modules. The modules time division multiplex the global links, with a destination module then demultiplexing the global links allowing the links to pass through to another FPGA. The modules are configured to transmit individual ones of the global links at time intervals determined in response to a ready time of the individual links. The ready times of individual global links are determined in response to receipt of parent global links and signal propagation delays across the modules. A parent of a particular global link is a link that affects a logic value of the global link. The present invention allows computation and communication simultaneously. Previously, the calculations and communications were divided into discrete phases within each emulation clock period.

20 Claims, 11 Drawing Sheets

OTHER PUBLICATIONS

D. Bursky, "Fast Simulator Expands to Mimic 4 Million Gates," *Electronic Design*, p. 23 (Dec. 29, 1986).

D. Bertsekas, et al., "Messages and Switching," Routing in the Codex Network, and Using Antifuse Programming for Gate–Array Density and Flexibility, *Data Networks*, (Englewood Cliffs, NJ: Prentice–Hall), pp. 8–14, 91–95, and 403–405 (1987).

D. Bursky, "Using Antifuse Programming for Gate–Array Density and Flexibility, an FPGA Family Also Delivers Masked–Array Performance. FPGAs Mirror Masked Gay–Array Architecture," *Electronic Design*, pp. 63–67, (Nov. 21, 1991).

P. Kermani, et al., "Virtual Cut–Through: A New Computer Communication Switching Technique," *Computer Networks*, 3:267–286, (1979, Oct.).

R. Murgai, et al., " Logic Synthesis for Programmable Gate Arrays," *27th ACM/IEEE Design Automation Conference*, pp. 620–625 (1990).

S. Singh, et al., "Optimization of Field–Programmable Gate Array Logic Block Architecture for Speed," *IEEE Custom Integrated Circuits Conference*, pp. 611–616 (1991).

W.J. Dally, "Virtual–Channel Flow Control," *IEEE Transactions on Parallel and Distributed Systems*, 3(2):194–205 (1992).

J. Rose, et al., "Architecture of Field–Programmable Gate Arrays: The Effect of Logic Block Functionality on Area Efficiency," *IEEE Journal of Solid–State Circuits*, 25(5):1217–1225 (1990).

Y.C. Wei, et al., "Multiple–Level Partitioning: An Application to the Very Large –Scale Hardware Simulator," *IEEE Journal of Solid–State Circuits*, 26(5):706–716 (1991).

Z. Lavi, "The SuperSim –An Ultrafast Hardware Logic Simulator,", *IFIP Workshop on CAD Engines*, Tokyo (Jun. 6–9, 1987).

R. Wittenberg, "Three Newcomers Stir Up Hardware Accelerator Market," *Circle Reader Service*.

A.J.G. Hey, "Supercomputing with Transputers –Past, Present and Future," *Computer and Architecture News Int. Conf. Supercomputing*, 18(3):479–489 (1990).

O.P. Agrawal, "Field Programmable Gate Arrays (FPGAs) Provide Asic System Designers Control of Their Design Destiny," *ElectroConference Record*, 15:353–361 (1990).

J. Babb, et al. "Virtual Wires: Overcoming Pin Limitations in FPGA–based Logic Emulators," *IEEE Workshop on FPGAs for Custom Computing Machines*, 5(4):142–151 (1993).

C. Erickson, et al., "Logic Cell Array", *The Programmable Gate Array Design Handbook*, (XILINX, First Edition), pp. 1.9–1.14 (1986).

D.E. Van Den Bout, et al., "AnyBoard: An FPGA–Based, Reconfigurable System," *IEEE Design & Test of Computers*, pp. 21–30 (1992).

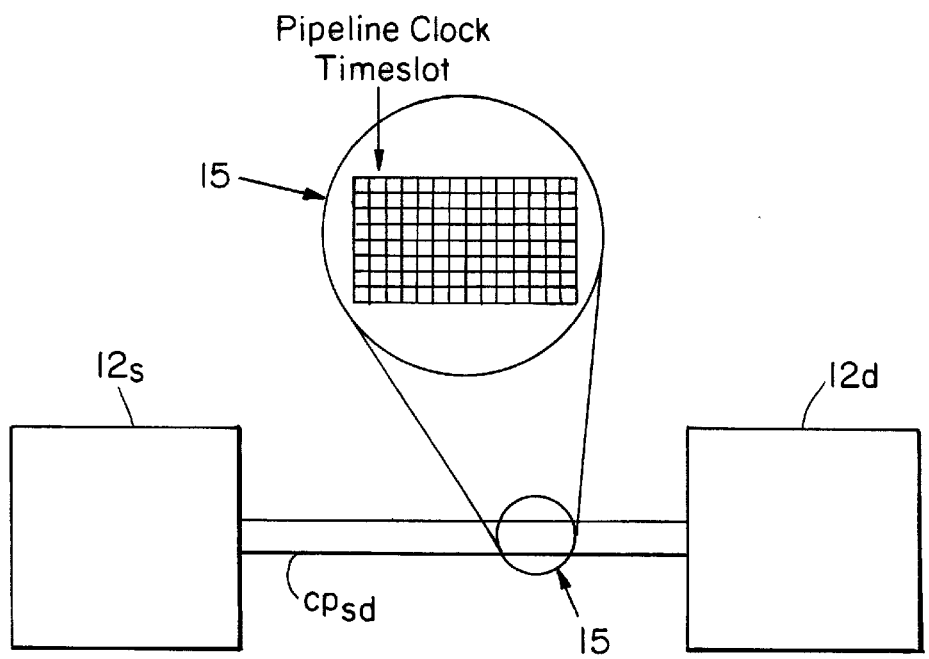
FIG. 11
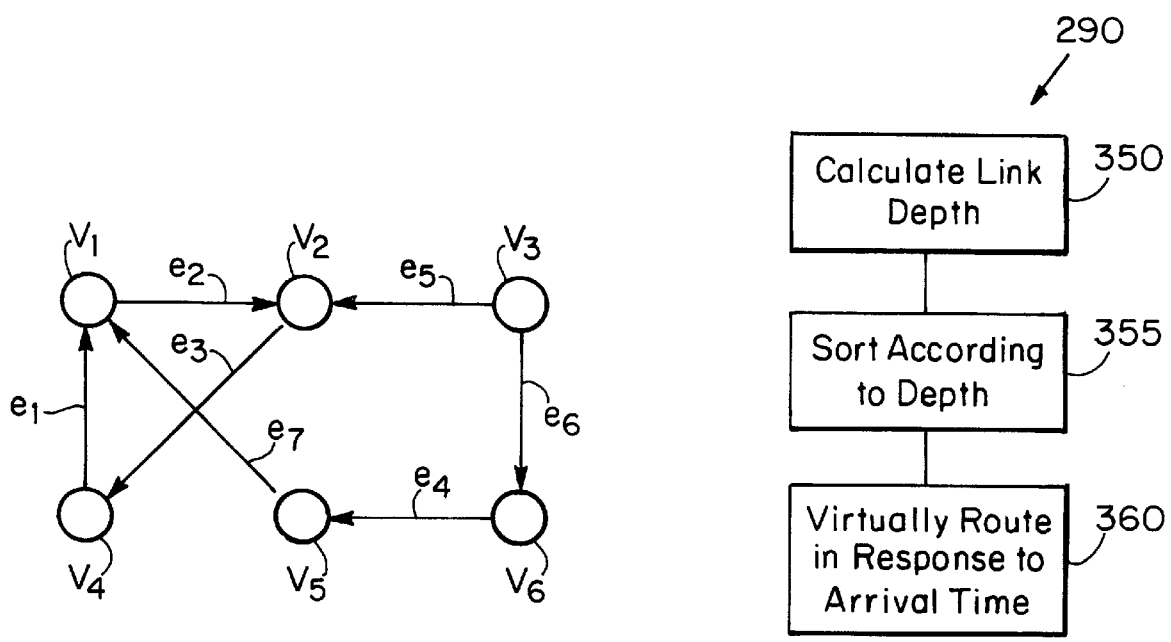
FIG. 12
FIG. 14

PIPE LINED STATIC ROUTER AND SCHEDULER FOR CONFIGURABLE LOGIC SYSTEM PERFORMING SIMULTANEOUS COMMUNICATIONS AND COMPUTATION

RELATED APPLICATIONS

This application is a continuation of application Ser. No. 08/344,723 filed Nov. 23, 1994 now U.S. Pat. No. 5,659,716 which is related to U.S. Ser. No. 08/333,131, entitled "Programmable Multiplexing Input-Output Port" now abandoned.

BACKGROUND OF THE INVENTION

Configurable or programmable logic devices are a general class of electronic devices that can be easily configured to perform a desired logic operation or calculation. Mask Programmed Gate Arrays (MPGA) offer density and performance. Poor turn around time coupled with only one-time configurability tend to advocate against MPGA usage. Field Programmable Gate Arrays (FPGA) offer lower levels of integration but are reconfigurable, i.e., the same FPGA may be programmed many times to perform different logic operations. Most importantly, the FPGAs can be programmed to create gate array prototypes instantaneously, allowing complete dynamic reconfigurability, something which MPGAs can not provide.

System designers commonly use configurable logic devices to test logic designs prior to manufacture or fabrication in an effort to expose design flaws. Usually, these tests take the form of emulations in which a configurable logic device models the logic design, such as a microprocessor, in order to confirm the proper operation of the logic design along with possibly its compatibility with a system in which it is intended to operate.

In the case of testing a proposed microprocessor logic design, a netlist describing the internal architecture of the microprocessor is compiled for and then loaded into a particular configurable logic device by some type of configuring device such as a host workstation. If the configurable logic device is a single or array of FPGAs, the loading step is as easy as down-loading a file describing the compiled netlist to the FPGAs using the host workstation or other computer. The programmed configurable logic device is then tested in the environment of a motherboard by confirming that its response to inputs agrees with the design criteria for the proposed microprocessor.

Alternatively, a configurable logic device also finds application as hardware accelerators for simulators. Rather than testing a logic design by programming a configurable device to "behave" as the logic device in the intended environment for the logic design, e.g., the motherboard, a simulation involves modeling the logic design and its environment on a workstation. In this context, the configurable logic device functions as a hardware accelerator that performs gate evaluations for portions of the model in order to relieve the workstation of this task and thereby decreases the time required for the simulation.

Recently, most of the attention in complex logic design emulation/simulation has been directed toward FPGAs. The lower integration of the FPGAs has been overcome by forming heterogeneous networks of special purpose FPGA processors connected to exchange signals via some type of interconnect. The network of the FPGAs is heterogeneous not necessarily in the sense that it is composed of an array of different devices, but that the devices have been individually configured to cooperatively execute different sections, or partitions, of the overall logic design. These networks rely on static routing at compile-time to organize the propagation of logic signals through the FPGA network. Static refers to the fact that all data or logic signal movement can be determined and optimized during compiling.

More recently, networks implementing time division multiplexing have been proposed and constructed. These emulators overcome the inherent pin limitations associated with each FPGA and the bandwidth/speed limitations of buses by configuring the FPGA to stack logic signals in time and then transmit the signals on successive clock pulses to a destination FPGA, possibly routing the signals through an intermediate FPGA or through networks, where the signals are then demultiplexed. See U.S. patent application Ser. No. 08/042,151, filed on Apr. 1, 1993 by the present inventors and incorporated herein by this reference.

SUMMARY OF THE INVENTION

The present invention was contemplated as an improvement over the prior art implementations. Previously, the computations and communications were divided into discrete phases within each emulation clock period. Although achieving superior results over the prior art, the full potential is not realized due to increased latency associated with the scheduling of the global link transmission between FPGAs. This potential shortcoming is corrected by the present invention.

In general, according to one aspect, the invention features a configurable logic system programmed to model a logic design such as a microprocessor. This system comprises an array of programmable logic modules, field programmable gate arrays in the preferred embodiment, each configured to perform a partition block of the logic design, and a module interconnect providing connections between the modules. The interconnect enables transmission of global links between the partition blocks of the modules. Thus, the interconnect need not be a separate structure. Portions of the FPGAs used for logic can be configured to do routing functions. Global links are the logic signals that must be transmitted between the partition blocks in order to realize the logic design.

At least one of the modules time division multiplexes and transmits the global links to a destination module, which then demultiplexes the global links. Time division multiplexing enables multiple global links to be transmitted from the same physical pin of the modules and across the same physical wire of the interconnect. The modules are configured to transmit individual ones of the global links at time intervals determined in response to a ready time of the individual links.

In the past, each period of the emulation clock was divided into rigid time frames or phases in which global link transmission occurred. Furthermore and more importantly, logic evaluation was not performed simultaneously with communication. In contrast the present invention relies on a flexible scheduling approach to decrease latency and alleviate congestion, inter alia. The global links are transmitted in response to their being ready, i.e., settled to a final value after waiting only for related links to be received at the FPGA and for propagation delays of the partition blocks. In prior systems, a given link could be routed only after all links (in every FPGA of the array) in a previous phase were received, not just links on which the given link depended.

In preferred embodiments, the ready times of individual global links are determined in response to receipt of parent global links. A parent of a particular global link is another global link that affects combinationally the logic value of the global link. Further, the ready times are also determined in response to propagation delays for combinatorial signals across partition blocks that generate the individual global links.

In other preferred embodiments, the modules comprise logic partition portions, configured to logically model a corresponding partition block by generating the corresponding global links, and separate communication portions. The communication portions comprise pipeline shift registers or multiplexers. The time multiplexing of the global links generated by the logic partition portions is performed by the communications portion prior to transmission over the interconnect between the modules. As a result, the programmable logic modules buffer global links until a path on the module interconnect becomes available.

In still other preferred embodiments, the system further comprises a pipeline clock received by the communication portions of the modules for defining time blocks for multiplexing the global links. The communications portions are adapted to transmit individual global links over periods of the pipeline clock determined in response to a time of receipt of parent global links and propagation delays across the logic partition portions. The global links having long paths between programmable logic modules are routed through intermediate programmable logic modules between source and destination programmable logic modules.

In general, according to another aspect, the invention features a method for compiling a netlist. This method comprises dividing the netlist into logic partition blocks to be loaded into programmable logic modules of an array. Individual global links are statically routed to be transmitted between the modules via an interconnect on time intervals defined by a clock signal, also called a virtual or pipeline clock, that is distinct from the emulation clock. The particular time intervals are determined in response to receipt of parent global links.

In preferred embodiments, the compiling further comprises determining link depths of the global links. Link depths refers to a number of other global links that must be routed after a given global link for correct synchronous operation. Priority to the routing of the global links is then assigned in response to the respective link depths.

In other preferred embodiments, the global links are divided into virtually routable global links and hard routable global links since ready times of global links on asynchronous routes can not be predicted at compile-time. Thus, only virtually routable global links are transmitted between the modules in response to the clock signal. Hard routed links are assigned dedicated paths, i.e., pins of the modules and conductors of the interconnect. Both hard and virtually routable links are preferably assigned a shortest path between a source and destination module.

In general, according to still another aspect, the invention features a configurable logic system programmed to model a logic design. This system comprises an array of programmable logic modules. A module interconnect provides connections between the modules of the array enabling transmission of global links between the modules. A configurer, such as a computer workstation, configures each one of the modules to perform a partition block of the logic design. The configurer further organizes the internal architecture of the modules to time division multiplex individual ones of the global links at time intervals determined in response to a ready time of the individual global links.

In specific embodiments, the ready times of individual global links are determined in response to receipt of parent global links and propagation delays across partition blocks.

The above and other features of the invention including various novel details of construction and combinations of parts, and other advantages, will now be more particularly described with reference to the accompanying drawings and pointed out in the claims. It will be understood that the particular method and device embodying the invention is shown by way of illustration and not as a limitation of the invention. The principles and features of this invention may be employed in various and numerous embodiments without the departing from the scope of the invention.

BRIEF DESCRIPTION OF THE DRAWINGS

In the accompanying drawings, like reference characters refer to the same parts throughout the different views. The drawings are not necessarily to scale. Emphasis is instead placed upon illustrating the principles of the invention. Of the drawings:

FIG. 11 illustrates the available pipe-line clock time slots available for a channel path of the present invention;

FIG. 12 illustrates a schematic graph data structure for indicating the FPGAs of the array and the utilized channel paths between these modules of the present invention;

FIG. 14 is a flow diagram illustrating the steps in routing the virtually routable global links according to the present invention.

DETAILED DESCRIPTION OF THE PREFERRED EMBODIMENTS

Figure 1A:
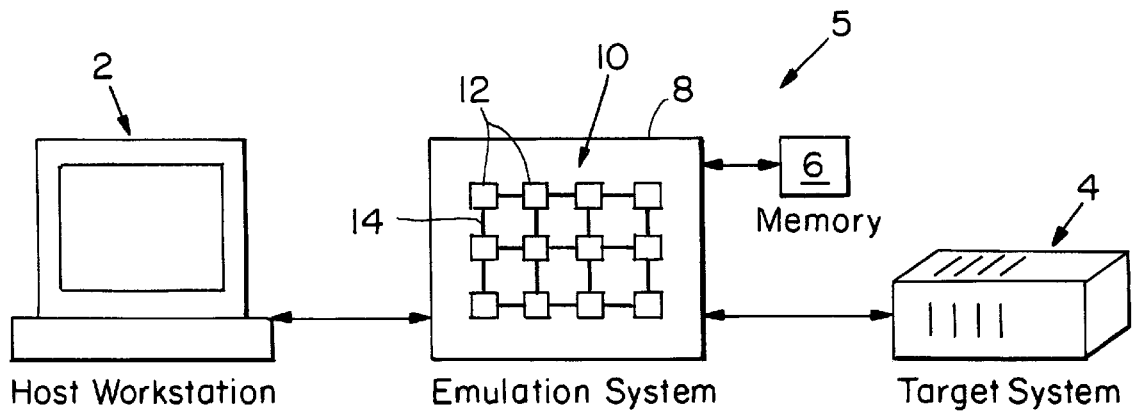
FIGS. 1a and 1b show a prior art logic emulation system, including a target system and host workstation, and the manner by which the netlist is divided into logic partition blocks and imposed on an FPGA array of the emulation system, respectively.
Figure 1B:
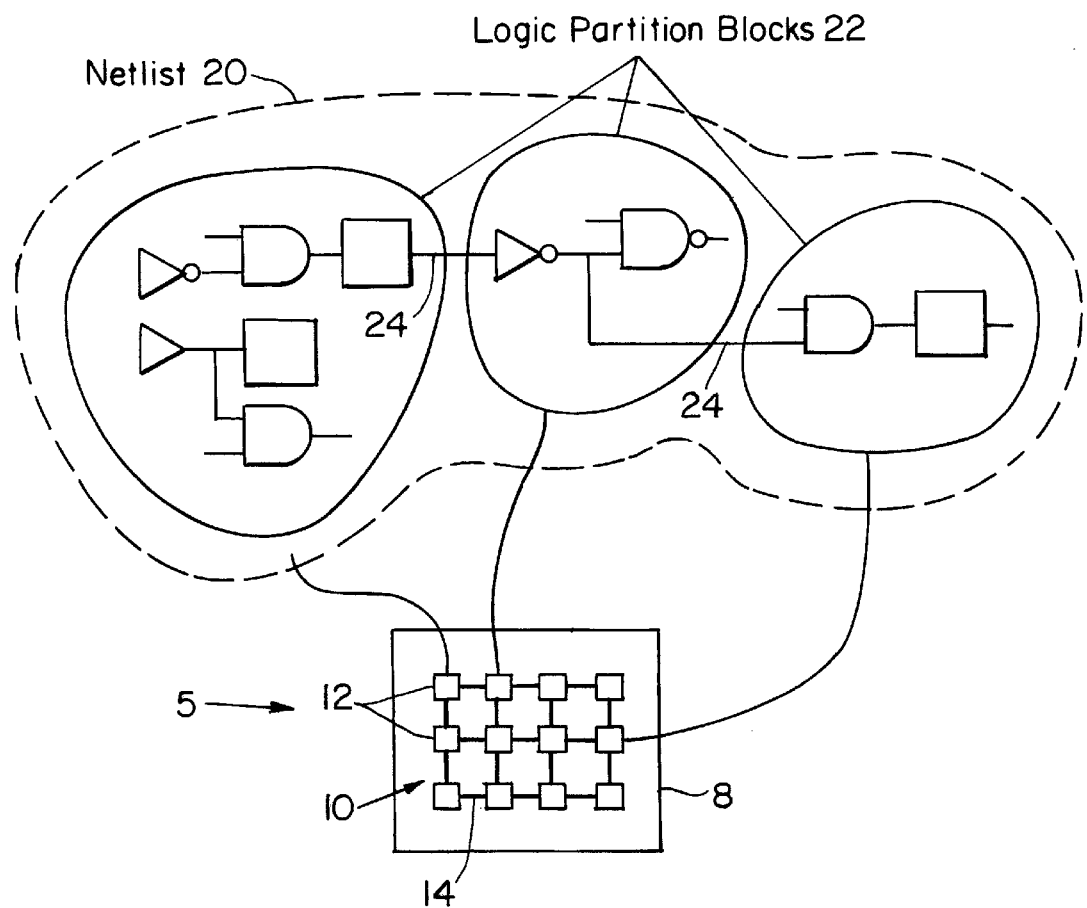

Turning now to the figures, a typical prior art logic emulation system 5 is illustrated in FIGS. 1a and 1b. An array 10, made up of individual FPGA chips 12, is connected to an interconnect 14 to form a network 8. The emulation system 5 further includes memory elements 6 that are accessed by the network 8.

The emulation system 5 is controlled and configured by a host workstation 2 that downloads compiled files defining a netlist of a logic design to be emulated. When properly configured, the FPGA emulation system 5 will behave as a logic design described by the netlist. The logic design is intended to be tested in the context of target system 4, to which the network 8 is directly wired, to serve as a test bed.

FIG. 1b illustrates how the logic design is impressed upon the array 10. The netlist 20 is separated into logic partition blocks 22. The complexity of the blocks 22 is manipulated so that each can be realized in a single FPGA chip 12. The logic signal connections 24 that must bridge the partition blocks, global links, are provided by the interconnect 14. Obviously, the exemplary netlist 20 has been substantially simplified for the purposes of this illustration.

Figure 2:
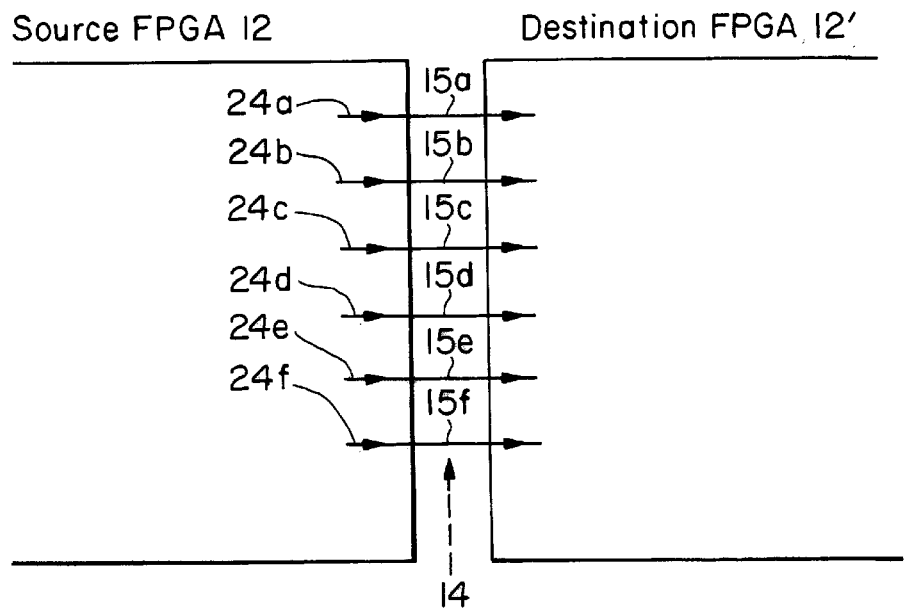
FIG. 2 is a block diagram of a prior art hardwire interconnect system between the FPGAs.

In most existing architectures, illustrated in FIG. 2, global links connectivity remains fixed for the duration of the emulation. For example, six global links 24a–f are allocated to six pins of the FPGA chip 12, which are connected to six physical wires 15a–f of the interconnect 14. Each emulated gate is mapped to one FPGA equivalent gate and each emulated signal is allocated to one pin of the FPGA. Thus, for a logic partition block 22 to be feasible, the partition gate and pin requirements must be no greater that the available FPGA resources. This constraint yields the following possible scenarios for each partition 22:

1. Gate limited: no unused gates, but some unused pins.
2. Pin limited: no unused pins, but some unused gates.
3. Not limited: unused FPGA pins and gates.
4. Balanced: no unused pins or gates.

For mapping typical netlists onto commercially available FPGA chips, partitions are predominately pin limited—all available gates cannot be utilized due to a lack of pin resources to support them. Low utilization of gate resources increases both the number of FPGAs in the network and the speed at which the emulation system 5 can be run. Pin limits set a hard upper bound on the maximum usable gate count of the FPGA.

Figure 3:
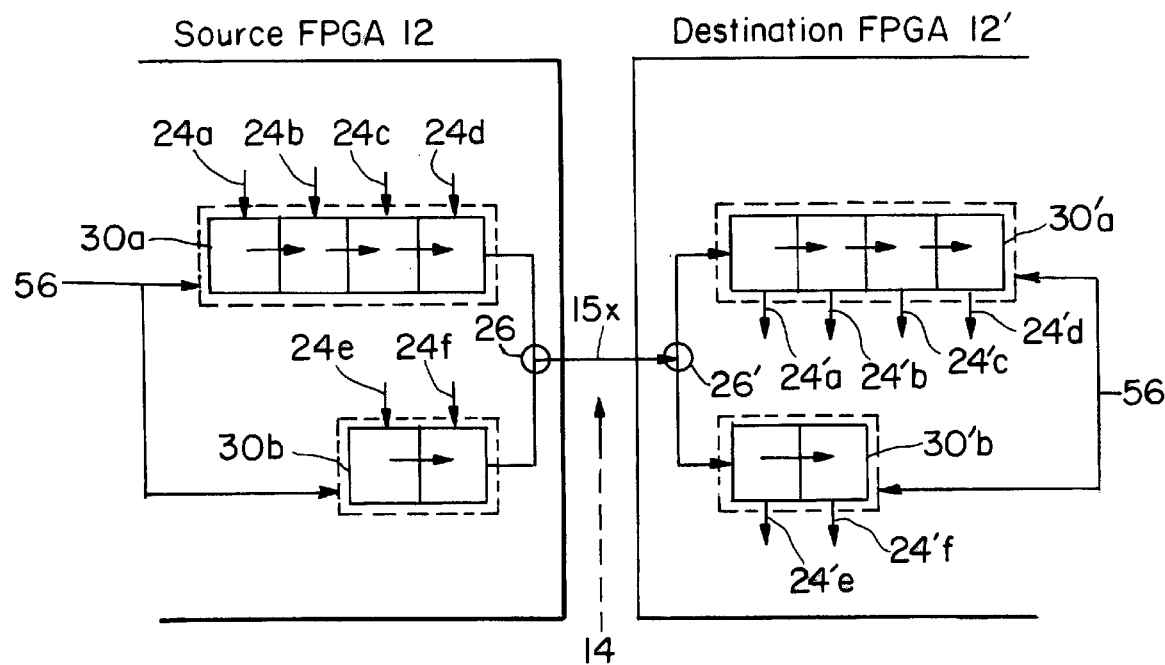
FIG. 3 is a block diagram of a virtual wire interconnect system between FPGAs.

More recently in U.S. patent application Ser. No. 08/042, 151, a virtual wiring scheme has been demonstrated to overcome pin limitations in FPGA-based logic emulators. FIG. 3 shows an example of six global links 24a–f, having the same source and destination FPGA 12, 12' and sharing a single physical wire 15x of the interconnect 14. The six global links 24a–f are time division multiplexed onto the single physical wire 15x by two pipe-line shift loops 30a, 30b. A virtual wire represents a global link connection between a source of a global link 24a–f on the source FPGA 12 and the destination FPGA 12'. These virtual wires increase available off-chip communication bandwidth by allocating the resources of a wire 15x among multiple global link signals (logical wire).

Virtual wires effectively relax pin limitations. Further, although the supporting logic, shift loops 30a, 30b, 30'a, 30'b, may contribute to propagation delays across FPGA chips 12, emulation speeds can be actually increased due to a reduction in system size.

Figure 4:
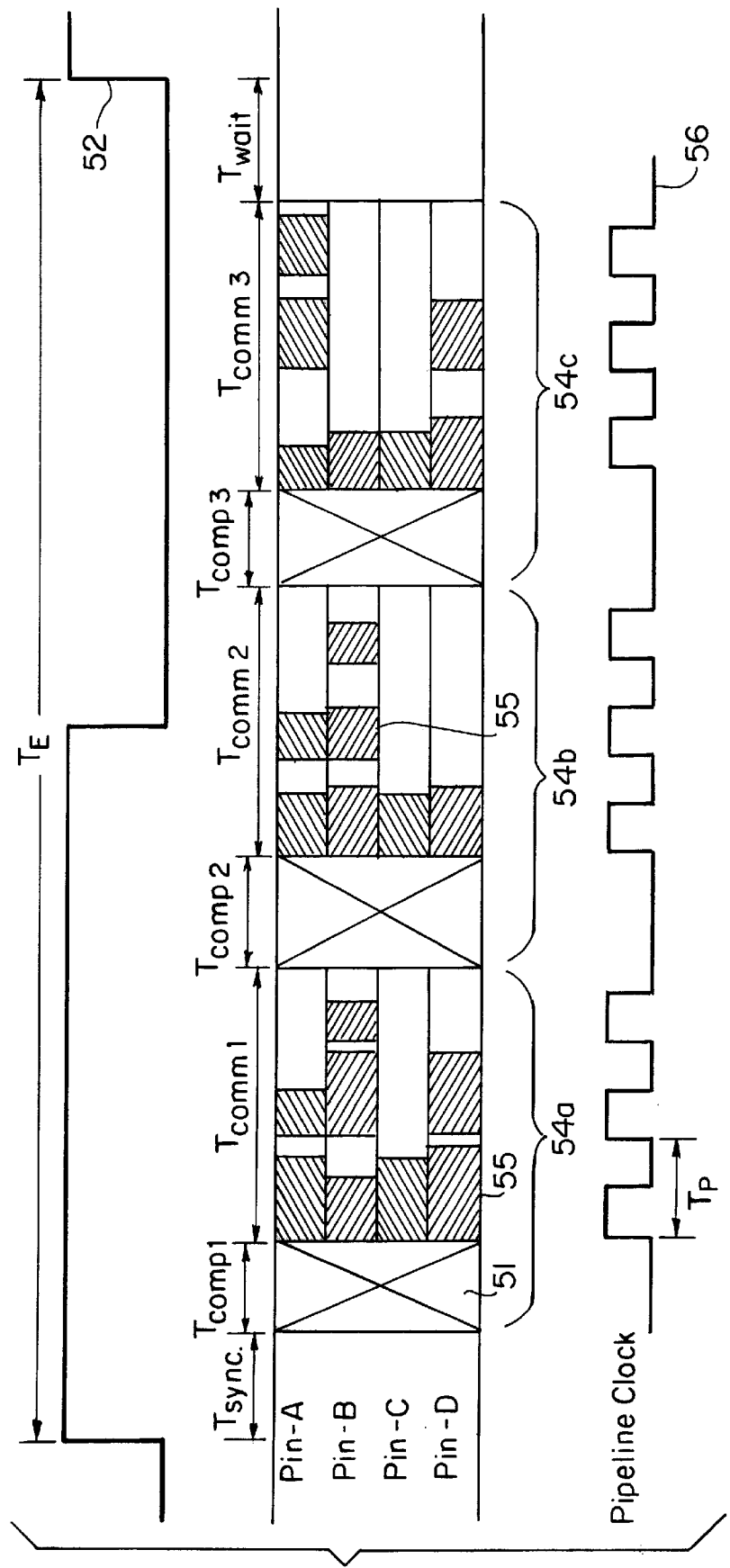
FIG. 4 is a timing diagram showing the phase division of the emulation clock period in the prior art.

In order to coordinate the movement of the signals through the shift loops 20, the network 8 has an internal pipe-line or virtual clock 56. As illustrated in FIG. 4, during each period $T_e$ of an emulation clock 52 of the target system 4, the pipe-line clock 56 undergoes multiple transitions. The pipe-line clock 56 is not entirely periodic within each period of the emulation clock $T_e$. Instead, each period $T_e$, is divided into intervals and phases. A time interval $T_{sync}$ at the beginning of the emulation clock period $T_e$ is a time required to synchronize to the free running target system clock 52. The length of the $T_{sync}$ interval can be estimated by the following equation:

$$T_p - T_u \leq T_{sync} \leq 2 \times T_p + T_u$$

where $T_u \ll T_p$ and is a tolerance variable that accounts for set up and hold times of FPGA registers, clock skew, and process/temperature variations. $T_{wait}$ is a time interval before the end of the target clock before the next target clock period transition. The target system clock period must be long enough so that $T_{wait} \geq T_p$.

The interval of the emulation clock period $T_e$, between the end of the $T_{sync}$ interval and before the beginning of the $T_{wait}$ interval is divided into three phases, 54a, 54b, 54c. Each of these phases corresponds to a time interval necessary for logic calculations to occur within the source FPGA chip 12, and then have the resulting global links clocked through the shift loops 30a, 30b to the destination FPGA chip 12'. Since the emulation clock $T_e$, is only broken up into the three phases in the particular embodiment shown, an output signal from the FPGA array 10 to the target system can not be the result of calculations with a combinational path across greater than three FPGA chips 12.

Each of the phases 54a, 54b, 54c is divided into a computational interval $T_{comp1\text{-}3}$ and a communication interval $T_{comm1\text{-}3}$. The computational interval $T_{comp1\text{-}3}$ is the time delay associated with the longest propagation delay of a combinatorial signal across any one of the FPGA chips 12 in the array 10. The communication portion $T_{comm1\text{-}3}$ then corresponds to the time necessary to transmit the global links across chip boundaries through the interconnect 14. Only during the communication portions $T_{comm1\text{-}3}$ does the pipe-line clock 56 undergo its transitions since it is needed here to clock the pipe-line shift registers 30 to time multiplex the global links 24a–24f. Specifically, global links appear at exemplary pins A–D at some of the pipe-line clock transitions and experience various propagation delays 55 to the destination FPGA 12'.

The above-described phase-based approach for organizing the computation within each FPGA chip 12 and communication across inter-FPGA chip boundaries results in substantial advantages over other prior art systems as generally enumerated above. Clocking during the communication intervals $T_{comm1\text{-}3}$ allows the time multiplexing of the global links 24a–f transmitted between the chips 12, effectively creating additional communication paths between the chips. Closer inspection of FIG. 4, however, exposes certain inherent inefficiencies of this approach.

First, as described earlier, the computation portion of each phase must be at least as long as the longest combinatorial signal propagation delay with respect to every one of the FPGA chips 12 in the array 10. This is so because all the combinatorial signals in every one of the FPGAs must have fully propagated through all of the gates within the FPGA and experienced the delays associated with each one of those gates before the pipe-line shift registers 30 are fully loaded to begin clocking the global links across the interconnect 14. As a result, the computational intervals $T_{comp1\text{-}3}$ are required to be at least as long as the longest propagation delays.

In a similar vein, the communication interval $T_{comm1\text{-}3}$ of each phase 54a–c is also limited by the longest propagation delays across the interconnect 14 between the FPGA chips 12. The pipe-line clock periods $T_p$ can be tightly packed against each other to the extent that wires over which a first signal propagates can be reused by a second signal even before the first signal has reached its destination. The net time of the three communication intervals $T_{comm1-3}$ is, however, determined by the longest communication delays between the FPGA chips 12 since $T_{comm}$ must be long enough to enable every global link 24a–f to reach its destination FPGA before the next computation interval $T_{comp}$. Consequently, the speed of the FPGA array 10 and consequently the shortest emulation clock period $T_e$, is limited by the longest communication delays within the interconnect 14.

Figure 5:
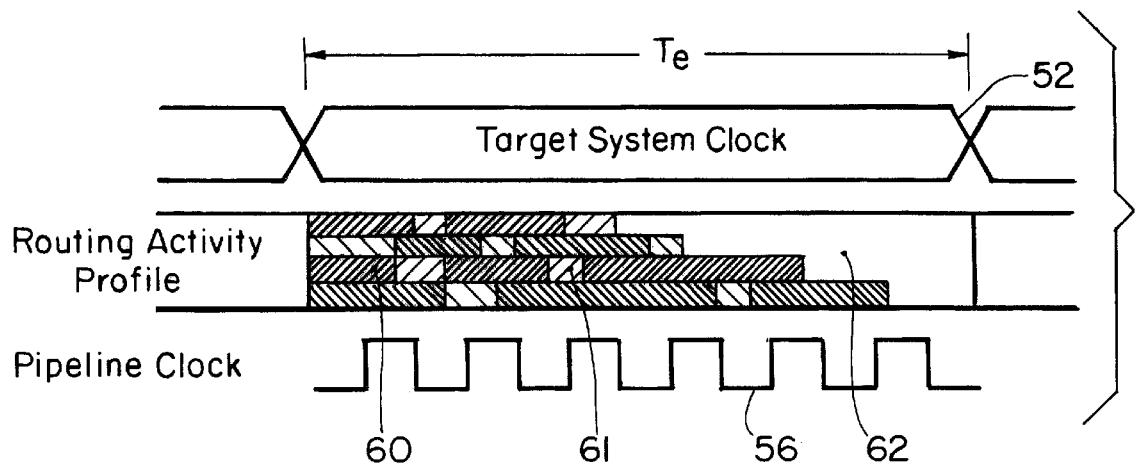
FIG. 5 is a timing diagram showing the simultaneous computation and communication according to the present invention.

Turning now to FIG. 5, a timing diagram of a router activity profile is shown for the present invention. Here, rather than breaking the emulation clock period $T_e$ into discrete phases and then dividing each of these phases into a computational interval and a communication interval, inter-chip communication and intra-chip computation are both packed as tightly as possible in order to minimize idle time 62 and thus maximize the emulation clock frequency. Thus, computation and communication occur simultaneously thereby decreasing the time for an emulation clock cycle. Moreover, logic overhead to support virtual wires is smaller because fewer pipeline clock periods are present in an emulation clock period.

One way of visualizing the invention is that the logic combinatorial signals are allowed to propagate through the logic contained in a chip 12 asynchronously, i.e., whenever available. When these individual signals reach the chip boundaries as global links 24a–f, they are synchronously clocked out the chip pins through the interconnect 14 to the next chip. Thus, each signal does not wait for every other global link to reach this stage—provided, of course there is no congestion at the chip pins.

Figure 6A:
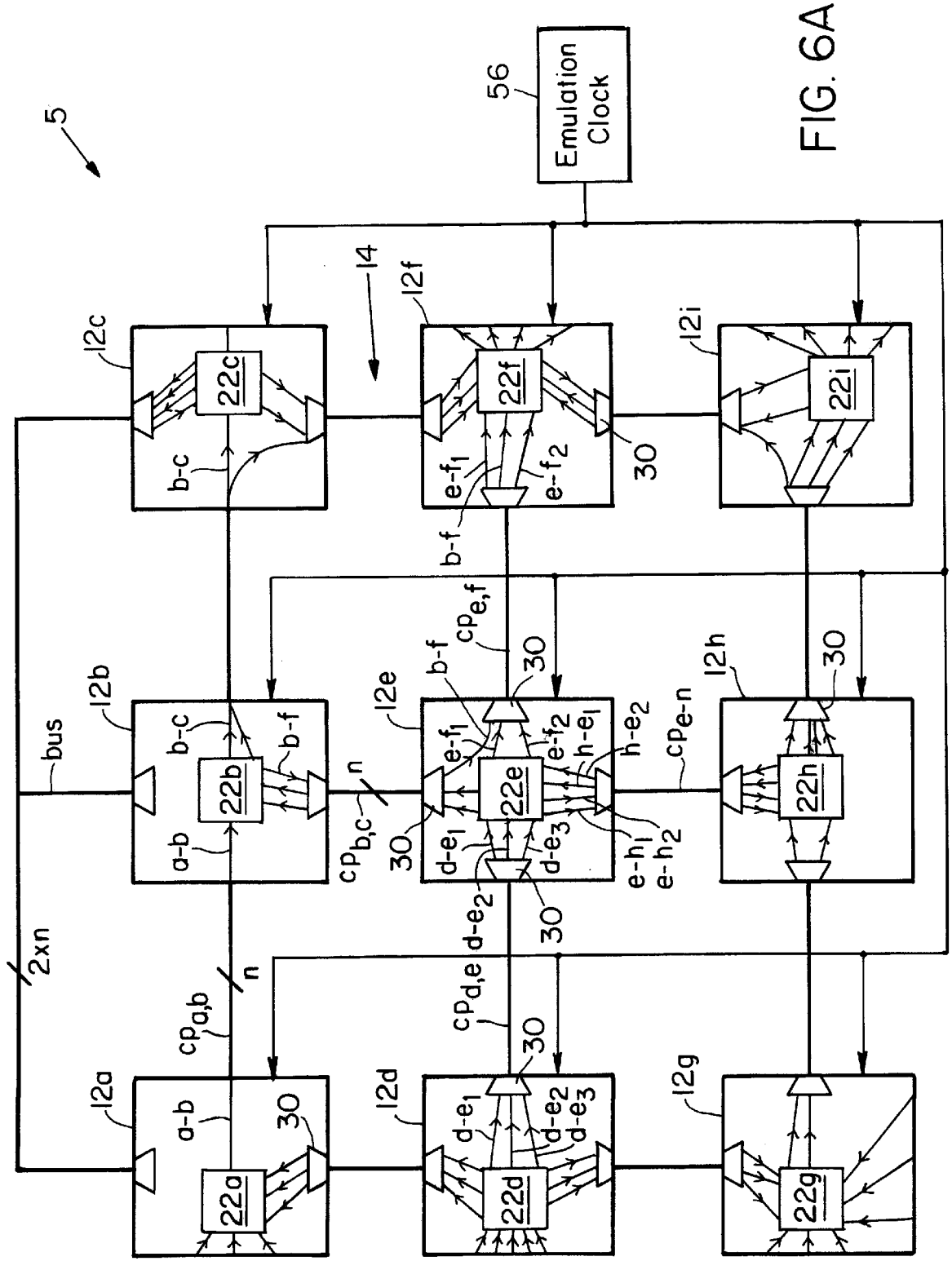
FIG. 6a shows an exemplary logic design that is programmed into an emulation system of the present invention.

The static routing conducted according to the principles of the present invention can best be understood by first considering an exemplary logic design, simplified for the purposes of this explanation, that has been programmed into an emulation system 5 of the present invention illustrated in FIG. 6. As generally described previously, FPGA chips 12a–i are electrically connected via an interconnect 14. The interconnect 14 is composed of channel paths $cp_{x,y}$. For example, FPGA chips 12d and 12e are connected via channel path $cp_{de}$. A number of conductors n make up each of these channel paths $cp_{x,y}$. In one example embodiment n=8. The top most FPGA chips 12a, 12b, 12c are additionally connected via a bus comprised of 2×n conductors, or 16 in the example embodiment. A pipeline or emulation clock 56 generates the pipeline or virtual clock signal, which is provided to each FPGA chip 12a–i.

Each of the FPGA chips 12a–i has a portion of the respective configurable logic gates that is configured to perform the logic function of a logic partition block 22 of the netlist. Additionally, another portion of the logic 30 is configured to time-multiplex the global links. In more detail, these multiplexing logic portions 30 time division multiplex the transmission of global links, e-$f_1$, e-$f_2$, for example, through the channel paths $cp_{e,f}$ between FPGA chips 12e, 12f. When the ultimate destination of a global link is not an adjacent FPGA through the interconnect, see global link b-f, then the links are transmitted though intermediate chips, 12c, to cover the long hop between 12b and 12f. As a result, global links may pass through intermediate FPGAs where they are re-multiplexed on a route between a source and destination FPGA.

Figure 7A:
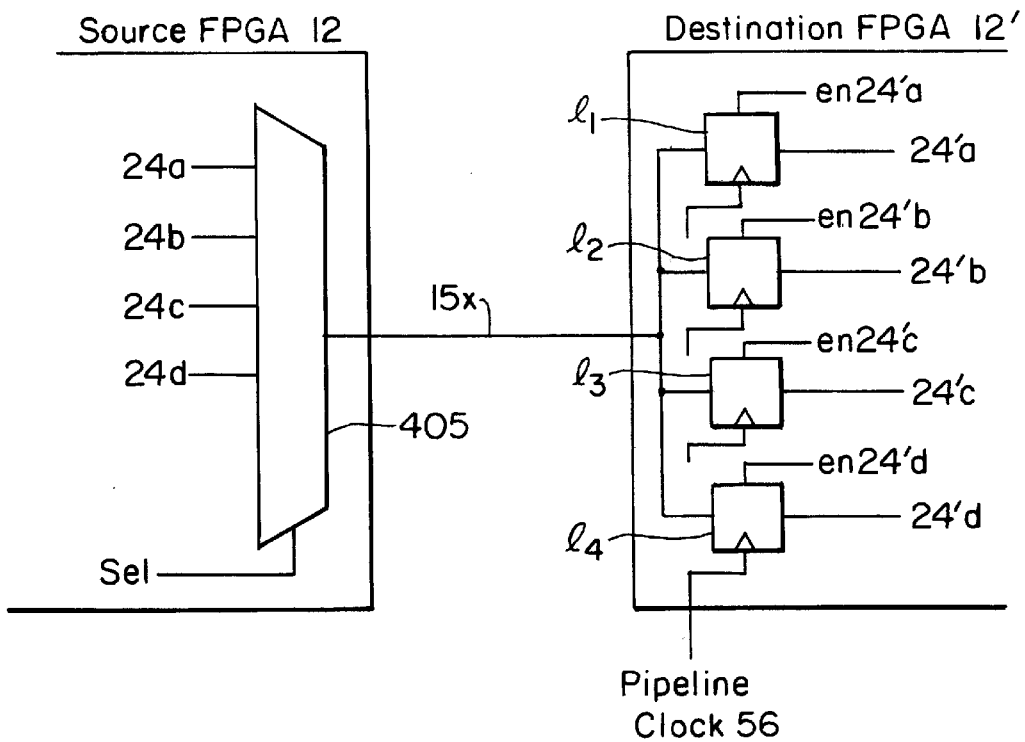
FIG. 7a, b and c are block diagrams of alternative virtual wire interconnect systems between FPGAs using multiplexers and flip-flops in place of shift registers.

The time-multiplexing logic 30 of each FPGA chip 12a–i is configured to perform the function of the pipe-line shift registers illustrated is FIG. 3. Alternatively, as illustrated in FIG. 7a, a multiplexer arrangement can be implemented. Here, a multiplexer 405 receives global links 24a–24d which are selectively transmitted through an FPGA chip pin onto line 15x in response to a selection signal Sel. The multiplexed global links are received at the destination FPGA 12' and demultiplexed by flip-flops $1_1$–$1_4$, which function as the shift registers 30'a and 30'b of FIG. 3. These flip-flops are clocked by the pipeline clock 56 and read by activating respective enable signals en 24'a–en 24'd.

Figure 7B:
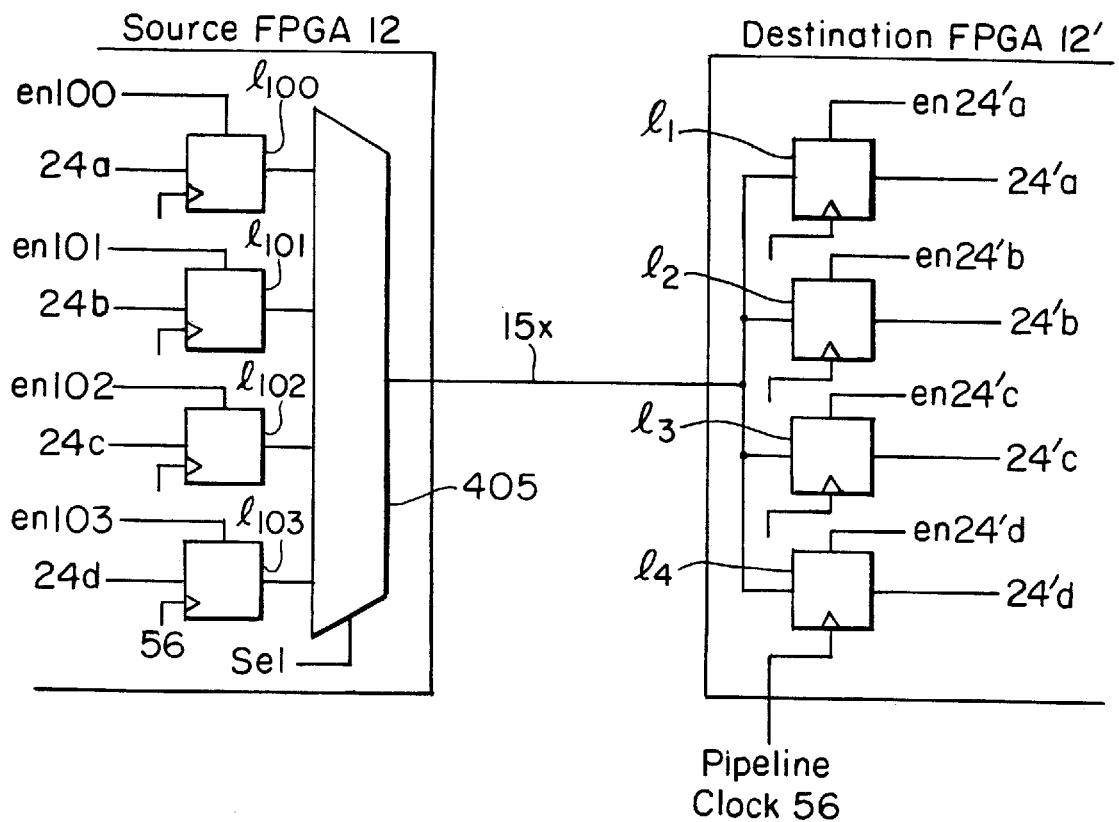

Referring to FIG. 7b, a hazard or glitch tolerate embodiment of the multiplexer arrangement is illustrated. Commonly, in many multiplexer logic constructions, voltage transients can be generated on the multiplexer output in response to a level change in one of the input signals, even when that input signal is currently not selected by the multiplexer. Hazards can be eliminated either by implementing: 1) hazard-free multiplexer designs, or 2) flip flops to isolate the multiplexer from the input signals. FIG. 7b achieves the multiplexer 405 isolation by including flip flops or latches $1_{100}$–$1_{103}$. Each of these flip flops receives a different global link 24a–24d and provides the corresponding global link to the multiplexer 405 in response to the pipeline clock signal 56 and the corresponding enable signal en100–en103.

Figure 7C:
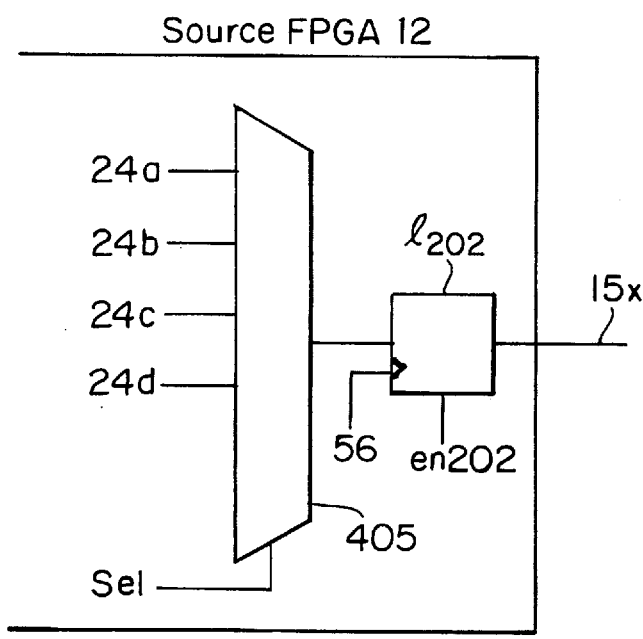

FIG. 7c illustrates a third implementation of the multiplexer arrangement designed to increase pipeline clock frequency. Typically, the pipeline clock period is chosen as the sum of the propagation time through the logic on the source FPGA, inter-FPGA crossing time, i.e., the propagation time through the interconnect to the destination FPGA, and the set up time at the inputs at the flip-flops or latches at the destination FPGA. A faster pipeline clock 56 can be used if a flip-flop $1_{202}$ is placed at the output of the multiplexer 405 on the source FPGA 12. When the flip-flop $1_{202}$ is implemented, the pipeline clock period can be decreased to the sum of the inter-FPGA crossing time, that is a propagation time through the interconnect, plus the set up time at the destination FPGA 12'. It should be noted, however, that in the case of long combinational paths on the source FPGA 12, multiple pipeline clock cycles 56 can be allocated to account for these intra-FPGA propagation times.

Figure 6B:
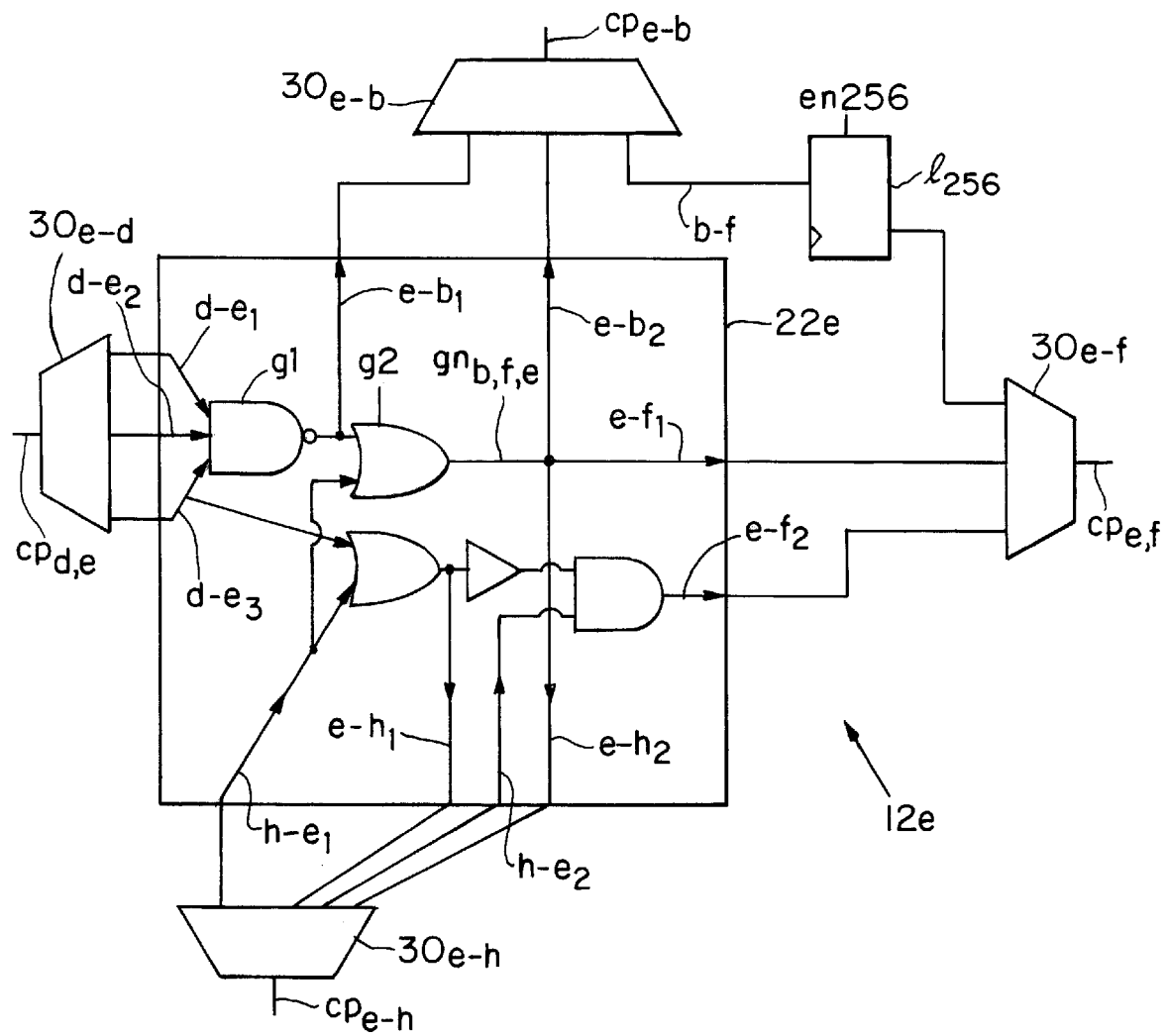
FIG. 6b shows an exemplary gate arrangement in a logic partition block of the present invention.

Referring to FIG. 6b, the internal logic organization of FPGA 12e is more completely illustrated. Generally, logic partition block 22e receives a number of global links d-$e_{1-3}$ and h-$e_{1,2}$. From these global links, the logic partition block 22e generates a number of outgoing global links e-$b_{1,2}$, e-$f_{1,2}$, and e-$h_{1,2}$, which are a function of the particular set of logic gates programmed into the logic partition block 22. For example, parent global links d-$e_{1-3}$ along with h-$e_1$ are logically combined by gates g1 and g2 to generate combinatorial signal and global net $gn_{bfe}$ which is divided off into three children, global links e-$b_2$, e-$f_1$ and e-$h_2$.

Another, global link, b-f, is simply passing through FPGA 12e to its destination FPGA 12f. Consequently, b-f is not implicated in logic partition block 22e but passes directly from multiplexing logic portions $30_{e-b}$ to $30_{e-f}$. it should be noted, however, that b-f generally should not be routed through FPGA 12e without some buffering in a flip-flop or equivalent logic structure. This feature is necessitated by the fact that pin resources of the ultimate source and destination FPGAs, here 12b and 12f, and pin resources of the intermediate FPGA 12e can not, or should not, be tied up for the time necessary for this global link b-f to propogate between 12b and 12e. Unless the global link is hard routed, its path from 12b should be isolated at the intermediate FPGA 12e by a flip-flop. This requirement can be satisfied if a flip-flop is part of the demultiplexing logic $30_{e\text{-}b}$, as shown for example in FIG. 7b, or by adding a flip-flop $1_{256}$, as shown.

Figure 6C:
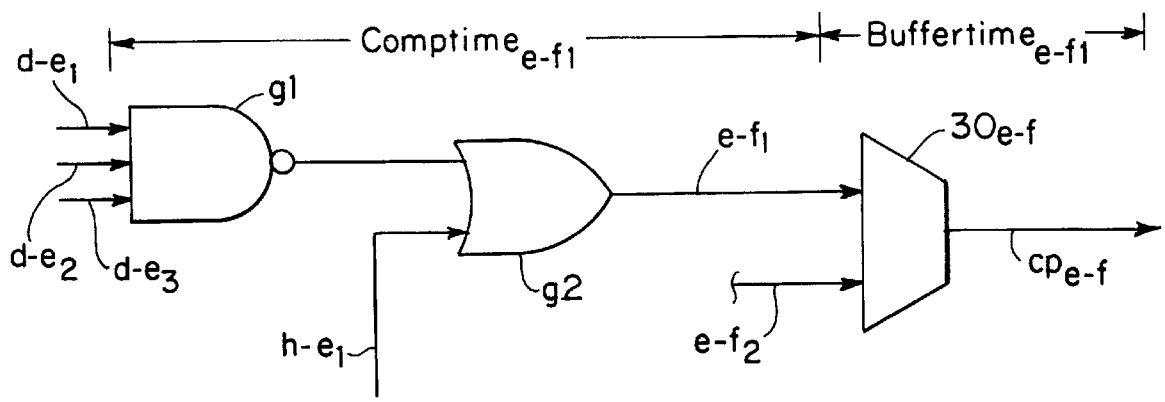
FIG. 6c shows the inventive timing arrangement for a portion of the logic shown in FIG. 6b.

Referring to FIG. 6c, according to the present invention, the inter-chip transmission and the intra-chip computation is not segregated into discrete phases. Instead, the global link e-f$_1$ is scheduled to be transmitted to FPGA chip 12f by the multiplexing logic $30_{e\text{-}f}$ once this combinatorial signal is ready. More specifically, if global links d-e$_{1\text{-}3}$ and h-e$_1$ are termed the parents of global link e-f$_1$, then global link e-f$_1$ is scheduled for transmission by the multiplexing logic $30_{e\text{-}f}$ on channel paths cp$_{e\text{-}f}$ comptime$_{e\text{-}f1}$ after last one of the parents has been received into the logic partition block 22e. The global link e-f$_1$ appears on channel path cp$_{e\text{-}f}$ during the communication time interval delineated by the pipeline clock 56. Comptime$_{e\text{-}f1}$ refers to the propagation delay associated with the gates g1 and g2. In short, the inter-chip scheduling of global link transmission is formulated in response to receipt of the parents of that global link by the respective logic partition block after a delay corresponding to the required propagation time for the combinatorial signals of the parents to propagate through the logic of the logic partition block 22.

In the prior art system described in connection with FIG. 4, parent global links d-e$_{1\text{-}3}$ and h-e$_1$ would be received at gates g1 and g2, respectively, sometime within the interval T$_{comm1}$ of phase 1 since they must be multiplexed across channel path cp$_{d\text{-}e}$. Global link e-f$_1$ could reach its ultimate value while the time is still within T$_{comm1}$ if the parent global links are received early enough within this interval, especially since the propagation delay associated with only two gates, g1, g2, will be very short. Not until the end of time interval T$_{comp2}$ will the child global link e-f$_1$ be assumed to be ready for transmission. As a result, transmission of the global links between chips in response to discrete phases yields substantial idle time and inefficient use of the FPGA communication speed and bandwidth.

Returning to the description of the present invention with respect to FIG. 6c, the only additional delay experienced by the global link e-f$_1$ other than that inherent in the logic, is a time associated with the multiplexing logic $30_{e\text{-}f}$ buffertime e-f$_1$. As stated previously, the propagation of combinatorial signals through the logic of the logic partition blocks 22 is, for the most part, asynchronous. That is to say, the combinatorial signals propagate through the various gates and the final global link, e-f$_1$ for example, settles to its ultimate value only after the passage of the comptime for the particular logic involved. The transmission of the global links between the FPGA chips 12, however, must occur synchronously in response to the pipe-line clock 56 so that the destination FPGA will know exactly when to expect the links. As a result, the earliest time interval after the signal becomes ready and can be transmitted across the channel path cp$_{e\text{-}f}$ is the next transition of the pipe-line clock 56.

The buffering time may be longer if multiple global links are ready for transmission at essentially the same time. For example, assume both global links e-f$_1$ and e-f$_2$ are received at the multiplexing logic $30_{e\text{-}f}$ simultaneously, and the channel path cp$_{e\text{-}f}$ consists of only a single conductor. Even though both signals are ready, one of these global links will have to be buffered at the input to the multiplexing logic $30_{e\text{-}f}$ until the next transition of the pipe-line clock 56. This delay, however, is not unique to this invention but is also found in the prior art. But, the problem is exacerbated in the prior art since the communication of all the global links must happen during the communication interval T$_{comm}$. Here, the communication interval is effectively spread over the entire length of the emulation clock period T$_e$ by virtue of the fact that it is not limited to specific time intervals, thereby alleviating congestion.

Figure 8:
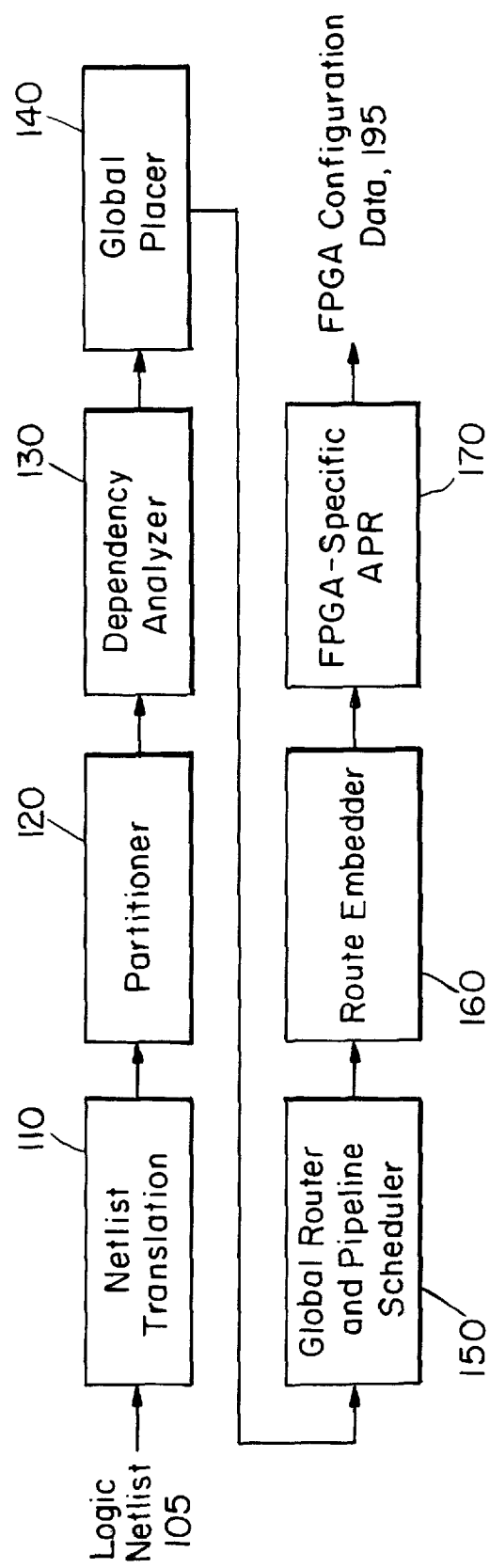
FIG. 8 is a flow diagram illustrating the compiling steps of the present invention.

The principles of the present invention are implemented during the compiling of the logic netlist of the logic design to be emulated as shown in FIG. 8. More specifically, the input to a virtual wire compiler running on the host workstation 2, for example, consists of a logic netlist of the emulated logic design, target FPGA device characteristics, and the interconnect topology of the network 8. The netlist is usually generated with a hardware description language or schematic capture program.

The logic netlist 105 is first translated and mapped to a library of FPGA macros, step 110. This operation is commonly performed before partitioning so that partition gate counts will accurately reflect the characteristics of the target FPGAs. Logic optimization tools can also be used at this stage to optimize the netlist for the architecture by considering the system as one large FPGA. After mapping the netlist to the target architecture, the netlist must be partitioned (step 120) into the logic partition blocks that can fit into the individual FPGAs of the array.

Because a combinatorial signal may pass through several FPGA partitions as global links during an emulated clock cycle, all signals will not be ready to schedule at the same time. This is best solved by only scheduling a given global link to leave a logic partition block once all of that link's parents are scheduled (step 130). To determine dependencies, the logic netlist is analyzed by backtracing from partition outputs, either output global links or output signals to the target system, to determine on which partition inputs, either input links or input signals from the target system, the outputs depend. In backtracing, it is assumed that all outputs depend on all inputs for gate library parts, and no outputs depend on any inputs for latch or register library parts. If there are no combinatorial loops that cross partition boundaries, this analysis produces a directed acyclic graph, used by a global router. If there are combinatorial loops, then the loops can be hardwired or implemented in a single FPGA.

Individual FPGA partitions must be placed into specific FPGAs (step 140). An ideal placement minimizes system communication, requiring fewer virtual wire cycles to transfer information. A preferred embodiment first makes a random placement followed by cost-reduction swaps and then optimizes with simulated annealing. During global routing (step 150), each global link is scheduled to be transferred across the interconnect 14 during a particular period of the pipe-line clock. This step, however, is discussed in more detail below.

Once global routing is completed, appropriately-sized multiplexers or shift loops 30 and associated logic are added to each partition to complete the internal configuration of each FPGA chip 22 (step 160). At this point, there is one netlist for each FPGA chip 22. These FPGA netlists are then processed in the vender-specific FPGA place-and-route software (step 170) to produce configuration bit streams (step 195). Technically, there is no additional hardware support for the multiplexing logic 30 which time-multiplex the global links through the interconnect 14: the array of configurable logic is itself configured to provide the support. The necessary "hardware" is compiled directly into the configuration of the FPGA chip 22.

Figure 9:
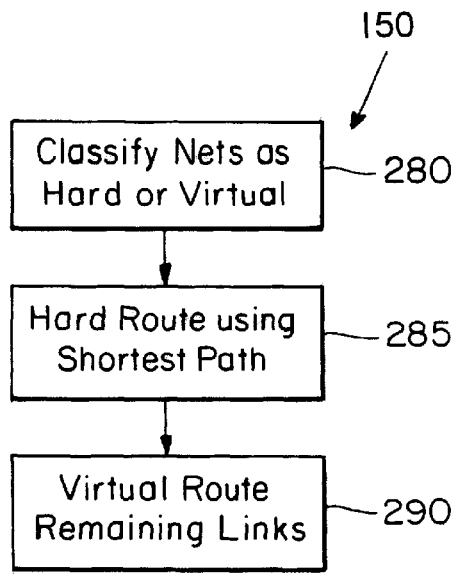
FIG. 9 is a flow diagram illustrating the static routing steps of the present invention.

Returning, the global routing (step 150 of FIG. 8) is performed as more particularly illustrated in the flow diagram of FIG. 9. As a first step, global nets, representing the connections between the partitions of each FPGA chip 12, are classified as either hard or virtual in dependence upon whether the particular global net can be routed virtually, time-division multiplexed across the interconnect 14, or must be hard routed, i.e., an FPGA chip pin and conductor of the interconnect 14 must be dedicated to the transmission of this signal (step 280). Most global nets will be classified as virtual as, for example, global net $gn_{bfe}$ of FIG. 6b. Some nets, however, will be on asynchronous paths that can not be virtually routed since their scheduling is not predictable at compile-time. Such hardwired links are depicted as links a–b, b–c of FIG. 6a, as evidenced by the lack of shift registers along their paths. Hardwiring can also be undertaken if surplus pins are available so that the overhead of multiplexers and/or shift registers can be reduced.

Figure 10A:
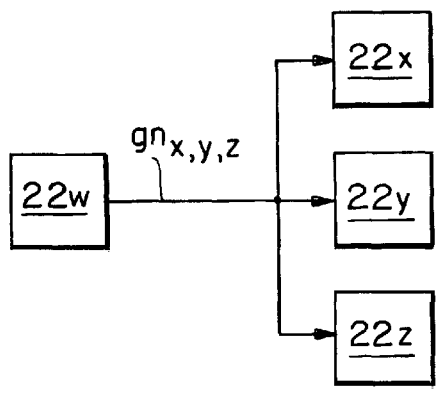
FIGS. 10a and 10b show the transition from global nets to global links according to the static routing method of the present invention.
Figure 10B:
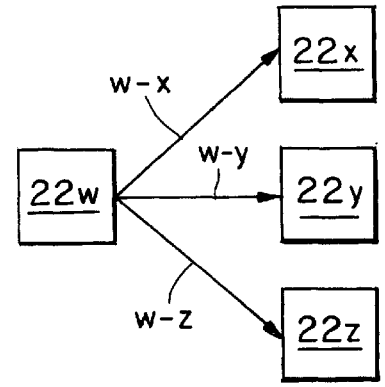

The hard and virtual global nets are then converted into global links representing inter-FPGA chip connections, but having only a single source FPGA and only a single destination FPGA. As illustrated in FIG. 10a, a global net $gn_{xyz}$ connecting one source logic partition block 22w and three designation blocks $22_{x-z}$ is converted into three global links w-x, w-y, w-z in FIG. 10b. Each one of these resulting links retains the hard or virtual classification of the original net.

In the next step 285, the hard global links are assigned to dedicated shortest path conductors of the channel paths cp between a source and destination FPGA. As illustrated in FIG. 11, a source 12s and destination FPGA 12d are connected via channel path $cp_{s,d}$. The communication resources of this channel path can be broken down into channel path conductors 15 corresponding to connections between a pin on the source FPGA 12s to a pin on the destination FPGA 12d (hardwire) and then virtual time slots corresponding to available time multiplexing positions on which a global link can be transmitted. In the context of hard routing, an entire conductor 15 of the channel path must be dedicated due to the fact that the signal will be, for example asynchronous, and consequently can not be restricted to a particular virtual time slot.

This hard routing step can take advantage of conventional hard routing techniques such as iterative route and rip-up trials and maze routing techniques. Preferably, however, it can be implemented as a simple shortest path routing procedure. This simplification is permissible since most prior art routing procedures must hard route all global links. Here, only a fraction of the global links must be hard routed, only those which are asynchronous or in some other way unpredictable. Then, because most signals can be virtual routed, the number of global links that can be routed is not limited by physical pin constraints.

Shortest path computations for the hard routing procedures are modeled on a graph of vertices and directed edges as shown in FIG. 12. Each vertex $v_n$ represents a single FPGA chip 12 in the network 8. Directed edges, $e_n$, which connect neighboring FPGA vertices, represent channel paths. Each directed edge $e_n$ has an associated weight which, in the hard routing procedure, is used to represent the level of congestion on the corresponding channel path cp. In the preferred scheme, the edge's weight is one (1) if the channel path's hard link availability is true and infinite otherwise. A single-pair shortest-path problem is solved by summing the edge weights along each channel path for potential routes between the source and destination FPGA. In this problem, a weighted, directed graph G=(V,E) with weight function ω for each edge is given. The weight of a path p=<$v_0$, $v_1$,...,$v_k$> is the sum of the weights of its constituent edges:

$$\omega(p) = \sum_{i=1}^{k} \omega(v_{i-1}, v_i)$$

The shortest-path weight from u to v by:

$$d(u,v)=\min(\omega(p):u\to v)$$

if a path exists from u to v, else $$d(u,v)=\infty$$

A shortest path from vertex u to v is defined as any path with weight ω(p)=d(u,v). The objective function of the single-pair shortest-path problem is to find a shortest path from u to v for given vertices u and v. In short, the shortest path is defined as the path with the least total edge weights between the source and destination FPGA.

Figure 13:
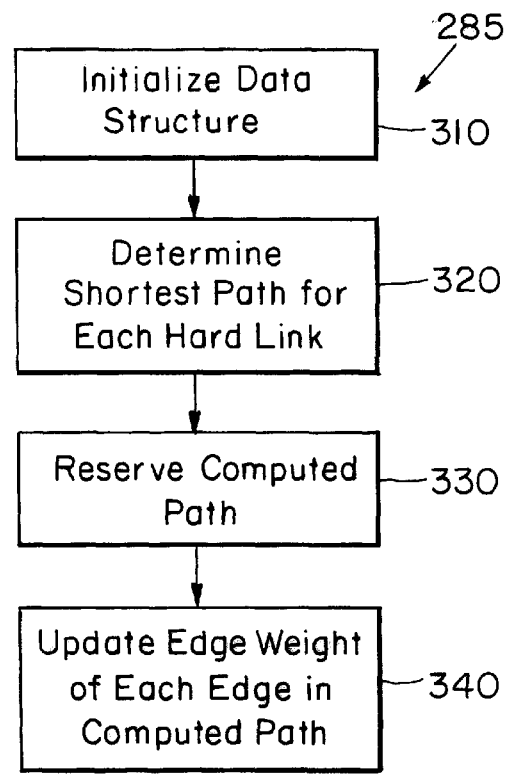
FIG. 13 is a flow diagram illustrating the steps in hard routing the global links according to the present invention.

Referring to FIG. 13, the hard routing procedure can be described in the context of a flow diagram. In step 310, a graph data structure such as that illustrated in FIG. 11, is initialized by allocating a vertex for every FPGA in the array 10. Then for each channel path connecting the FPGAs, a directed edge is assigned and initialized to value of 1 for the edge weight.

Each global link that is to be hard routed is consecutively taken up and the shortest path between the source and destination FPGA is determined using Dijkstra's algorithm on the graph data structure (step 320). The Dijkstra's algorithm implemented in the present invention is described in *Introduction to Algorithms*, MIT Press, Cambridge, Mass., 1992, by Cormen, et al. which solves single-pair shortest-path problems for non-negative edge weights. Here, since all non-infinite weights are unity, we replace the priority queue in Dijkstra's algorithm with a simple first in/first out buffer, thereby lowering the execution time for the algorithm. More sophisticated implementations could go back and rip up previously routed paths in the event that no available path between the source and destination FPGAs is found. Once the shortest path has been returned, this path is reserved in step 330 by incrementing a variable holding the use of this path. A particular channel path conductor is reserved for the hard routed link. In addition, the edge weight is updated to reflect the assignment of the global link in step 340. In the preferred implementation, the edge weight is unity unless the channel is unavailable because the channel hard use becomes equal to the channel width, and then the edge weight is set to infinity.

Returning to FIG. 9, routing of the virtual global links occurs in step 290 after the hard routing procedure. As more specifically illustrated in FIG. 14, the link depth of each global link is calculated (step 350). The link depth refers to the minimum number of pipe-line clock periods that must follow the departure of a given global link for that link and the minimal set of other global links (that link's children) which must be routed strictly after the given link for correct synchronous operation. More simply, the depth computation exposes the set of related or dependent links that will take the longest time to propagate through the network 8 taking into account both the time necessary to multiplex the global links on the interconnect 14 and time necessary for the combinatorial signals to propagate through each FPGA chip 12, the logic delay comptime across a partition.

Once the depth calculations are made for each global link, the links are sorted in step 355 according to depth to ensure that the deepest links will be routed first and also to ensure that the global links from which any given global link depends will be routed before that global link. Finally, the sorted global links are virtually routed (step 360).

For the purposes of virtual routing, it is convenient to think of each channel's routing resource as a two dimensional array of "routing slots" as in FIG. 11. A row corresponds to a pin and each column to a pipeline clock period. At the time the virtual routing procedure is called, some channel pin slots, i.e., a entire row in FIG. 11, will be occupied by hard routed global links. These occupied pin slots will be reflected in a channel/hard use count. An additional counter, the channel/virtual use count represents the number of channel path conductors used by the virtual router at a particular timeslot. These counters are used to satisfy the channel width constraint.

The virtual routing is performed for each global link as the main global router procedure iterates across the list of sorted scheduling tokens. The ready time of a given link is determined as a function of, typically the sum, its parents arrival time in the relevant logic partition block 22 and the propagation delay of the partition logic. We assume that comptime, the logic propagation delay of each partition logic path, is a technology specified constant or is estimated from the partition logic critical path length, and can range from 0 pipeline cycles to many cycles. An initial departure time of the link to its destination FPGA chip is set to equal the link's ready time. The router finds a path from the link's source to destination FPGA leaving at this tentative departure time. If there are no available paths, the departure time is incremented to the next period of the pipe-line clock 56 and this step is repeated until an available time slot is found. In contrast, the prior art algorithm would have to wait for the commencement of an entirely new phase at this point. As in the case of the hard routing, virtual routing is implemented using the shortest path algorithm. Each edge also has an associated congestion weight, which is a function of time. In the simplest scheme, the edge's weight is 1 at time t if that channel's virtual channel availability is true at time t and $\infty$ otherwise. The virtual link path is determined according to a modified Dijkstra's algorithm.

Experimental Results and Analysis

The pipe-lined static router described above was implemented by developing the global routing portion of the 'Virtualizer' compilation system under development at Virtual Machine Works, Inc. This router is coded in the C++ programming language and runs in a few minutes on a SPARC 2 workstation for typical designs.

To evaluate the benefits of this new router, two complex designs, Palindrome (PAL128) and Sparcle, were successfully routed. Palindrome is a 15K gate systolic circuit for detecting strings that read the same both forward and backwards—for example 'AHA'. Sparcle is an 18K Sparc microprocessor with modifications to enhance its usefulness in a multiprocessor environment. These designs were routed with both the inventive router and the prior art phase-based router as described in connection with FIG. 4.

Ideally, direct comparison of routing results is preferable. The inventive compiler was targeted at both the Clos-like RIP10 FPGA and two dimensional mesh topologies. The prior art compiler is targeted at only two dimensional mesh topologies. All routes were latency limited, that is the emulation period $T_e$, was determined by the total number of FPGA hops encountered by signals as opposed to the amount of congestion for a given channel. Therefore, accurate estimation of the results of using the prior art router on the RIP10 topology is possible from the routing statistics. As described by the present inventors in "Virtual Wires: Overcoming Pin Limitations in FPGA-based Logic Emulators", in *Proceedings IEEE Workshop on FPGA-based Custom Computing Machines*, pages 142–151, Napa, Calif., April 1993. IEEE. January 1993, for latency-dominated routes, the total number of timesteps, N, for the prior art router is:

$$N = L \times D$$

where L is the length of the longest path in the network dependency graph in terms of FPGA partitions, and D is the network diameter. D for the RIP10 is 2, L for the palindrome is 3. For the inventive router, this equation becomes:

$$N = L \times dc_{avg}$$

where $dc_{avg}$ is the average distance in terms of FPGA crossings between source and destination FPGAs of routes along the critical path. For estimation, it can be assumed that $dc_{avg} = d_{avg}$, the average distance of all routes. $dc_{avg}$ is typically much smaller than D the network diameter.

Table 1 shows the corresponding actual and estimated number of timesteps for routing both Palindrome and Sparcle on both the RIP10 topology and 2D meshes. The actual numbers were reported directly from the respective routers. The estimates for the prior art router were derived using the respective equations for N. For example, to estimate the prior art timestep count for Palindrome 128 on the RIP10 network diameter D=2 giving N=6. The timestep count of the present router for Sparcle on a 4×5 mesh, we multiple L=10 by the average distance $dc_{avg}=2.8$ giving N≈28. Note that $dc_{avg}$ is close to $d_{avg}=2.33$ and both are much less than D, which is 8. The critical path and distance averages are reported by both routers. Note that it is assumed that computation takes zero time (i.e., comptime less than one timestep) for this comparison. Taking computation time into account does not materially impact these results.

TABLE 1

Number of VirtualWire Timesteps
(Emulation Speed assuming a 25 MHz Timestep)

| Design | Topology | MIT Phase-based Router | VMW Pipe-lined Static Router |
|---|---|---|---|
| PAL128 | 4 × 4 mesh | 21 steps (1.19 MHZ) | 6 steps (4.17 MHZ)* |
| | RIPP10 | 6 steps (4.17.MHZ)* | 4 steps (6.25 MHZ) |
| Sparcle | 4 × 5 mesh | 88 steps (0.28 MHZ) | 28 steps (0.96 MHZ) |
| | RIPP10 | 20 steps (1.25 MHZ)* | 12 steps (2.08 MHZ) |

*estimated

The results in Table 1 show that the inventive pipe-lined static router performs better than the prior art phase-based router for all cases. The new router speeds up execution by roughly $D/d_{avg}$, ranging from 1.5X–3.5X for these cases.

The experimental examples are all latency-limited. In addition to improvements for latency-limited designs, improvements in the bandwidth-limited cases are also expected because:

Communication is overlapped with computation,

Phase startup and termination overheads are avoided, and

Scheduling congestions can be more easily avoided with fine-grain schedules.

In the prior art phase-based approach, at the end of each phase the entire communication network was idle while computation took place. This 'dead' time, which may be one or more timesteps, represents wasted bandwidth. Phase startup and termination overhead were caused by the phase barriers. No communication paths could cross phases, thus each multiple-hop path must be filled and drained each phase, wasting approximately $n^2/2$ routing timeslots for each path in each phase, where n is the path length. Finally, locking down paths for the duration of phases causes scheduling congestions, which the new router avoids.

While this invention has been particularly shown and describe with references to preferred embodiments thereof, it will be understood by those skilled in the art that various changes in form and details may be made therein without departing from the spirit and scope of the invention as defined by the appended claims. For example, while the preceding 17 description has been particular to emulator design, those skilled in the art will understand that the principles of the invention are applicable to simulators, hardware accelerators, or any configurable logic application confronting pin and/or latency limitations.

We claim:

1. A configurable logic system programmed to interact with a target system supplying a clock signal, the logic system comprising an array of programmable logic modules each configured to perform a partition block, and a module interconnect providing connections between the modules of the array enabling transmission of global links between the partition blocks of the modules, at least one of modules transmitting multiple ones of the global links over the same conductors of the interconnect during a single cycle of the clock signal to another one of the modules, which samples the multiple global links, the modules being configured to transmit some of the global links intervals determined in response to a ready time of the simultaneously with determining values of other global links.

2. A configurable logic system as claimed in claim 1, wherein the modules comprise:

logic partition portions configured to logically model a corresponding partition block by generating the corresponding global links; and communication portions configured to time multiplex the multiple global links over the same conductor generated by the logic partition portions for transmission over the interconnect between the modules.

3. A configurable logic system as claimed in claim 2, further comprising a pipeline clock, dividing the clock signal, received by the communication portions of the modules for defining time blocks for multiplexing the global links.

4. A configurable logic system as claimed in claim 3, wherein the global links having long paths between programmable logic modules are routed through intermediate programmable logic modules between source and destination programmable logic modules.

5. A configurable logic system as claimed in claim 3, wherein the programmable logic modules buffer global links in flip-flops or registers until a path on the module interconnect becomes available.

6. A configurable logic system as claimed in claim 2, wherein the communication portions comprise pipeline shift registers.

7. A configurable logic system as claimed in claim 2, wherein the communication portions comprise multiplexers.

8. A configurable logic system as claimed in claim 7, wherein the communication portions further comprise flip flops at the inputs to the multiplexers.

9. A configurable logic system as claimed in claim 7, wherein the communication portions further comprise flip flops receiving outputs of the multiplexers.

10. A configurable logic system as claimed in claim 3, wherein the communications portions transmit individual global links over periods of the pipeline clock determined in response to a time of receipt of parent global links affecting a logic value of the individual global links.

11. A configurable logic system as claimed in claim 10, wherein the period of the pipeline clock over which individual global links are transmitted is further determined in response to propagation delays across the logic partition portions for combinatorial signals generating the individual global links.

12. A configurable logic system as claimed in claim 1, wherein the modules are field programmable gate arrays.

13. A method for compiling a netlist comprising:

dividing the netlist into a logic partition blocks to be loaded into programmable logic modules of an array;

routing individual global links to be transmitted between the modules on an interconnect on time intervals defined by a pipe-line clock signal; and calculating values of some global links simultaneously with transmitting other global links over the interconnect.

14. A compiling method as claimed in claim 13, further comprising:

determining link depths of the global links, link depths referring to a number of other global links that must be routed after a given global link for correct operation; and assigning priority to the routing of the global links in response to the link depths.

15. A compiling method as claimed in claim 13, further comprising:

separating the global links into virtually routable global links and hard routable global links; and routing only virtually routable global links to be transmitted between the modules in response to the clock signal.

16. A compiling method as claimed in claim 13, further comprising allocating multiple periods of the pipe-line clock for the propagation delays across the logic partition blocks of the individual global links.

17. A compiling method as claimed in claim 13, further comprising determining a period of the pipe-line clock in response to a maximum propagation delay between programmable logic modules of the array.

18. A compiling method as claimed in claim 13, further comprising routing the individual global links along one or more shortest paths between a source and destination module.

19. A compiling method as claimed in claim 13, further comprising routing global links having long paths between programmable logic modules through intermediate programmable logic modules between source and destination programmable logic modules.

20. A configurable logic system programmed to model a logic design, the system comprising:

an array of means for performing logic partition blocks of the logic design; and means for transmitting global links between the partition block means;

wherein partition block means time division multiplex the global links transmitted over the transmission means while computing values of other global links.

* * * * *

UNITED STATES PATENT AND TRADEMARK OFFICE
CERTIFICATE OF CORRECTION

PATENT NO.  : 5,850,537
DATED       : December 15, 1998
INVENTOR(S) : Charles W. Selvidge, Anant Agarwal, Jonathan Babb, and Matthew L. Dahl It is certified that error appears in the above-identified patent and that said Letters Patent is hereby corrected as shown below:

In column 15, lines 27 and 28, please remove "intervals determined in response to a ready time of the".

Signed and Sealed this

Fourth Day of May, 1999

Attest:

Attesting Officer

Q. TODD DICKINSON

Acting Commissioner of Patents and Trademarks